(12) United States Patent
Heuck et al.

(10) Patent No.: US 12,160,215 B2
(45) Date of Patent: Dec. 3, 2024

(54) METHOD FOR MANUFACTURING A PIEZOELECTRIC RESONATOR

(71) Applicant: Robert Bosch GmbH, Stuttgart (DE)

(72) Inventors: Friedjof Heuck, Stuttgart (DE);
Marcus Pritschow, Nuertingen (DE);
Markus Kuhnke, Wannweil (DE);
Peter Schmollngruber, Aidlingen (DE); Ricardo Zamora, Stuttgart (DE);
Sebastien Loiseau, Stuttgart (DE);
Stefan Majoni, Weil im Schoenbuch (DE); Stefan Krause, Metzingen (DE);
Viktor Morosow, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 412 days.

(21) Appl. No.: 17/647,611

(22) Filed: Jan. 11, 2022

(65) Prior Publication Data
US 2022/0231652 A1 Jul. 21, 2022

(30) Foreign Application Priority Data
Jan. 21, 2021 (DE) ............ 10 2021 200 518.7

(51) Int. Cl.
*H03H 3/02* (2006.01)
*H03H 9/17* (2006.01)
*H03H 9/24* (2006.01)

(52) U.S. Cl.
CPC .............. *H03H 3/02* (2013.01); *H03H 9/172* (2013.01); *H03H 9/2405* (2013.01); *H03H 2003/027* (2013.01); *H03H 2009/241* (2013.01)

(58) Field of Classification Search
CPC ........ H03H 3/02; H03H 9/172; H03H 3/0072; H03H 9/15; H03H 9/2405;
(Continued)

(56) References Cited

U.S. PATENT DOCUMENTS 5,846,849 A * 12/1998 Shaw ................. B81C 1/00142
438/739
7,057,477 B2 * 6/2006 Wang .................. H03H 9/0557
333/191

(Continued)

OTHER PUBLICATIONS

Jaakkola et al., "Experimental Study of the Effects of Size Variations On Piezoelectrically Transduced Mems Resonators," IEEE International Frequency Control Symposium, 2010, pp. 410-414.

*Primary Examiner* — Donghai D Nguyen
(74) *Attorney, Agent, or Firm* — NORTON ROSE FULBRIGHT US LLP; Gerard A. Messina

(57) ABSTRACT

A method for manufacturing a piezoelectric resonator. The method includes: depositing a piezoelectric layer and forming a recess in a lateral area in such a way that a silicon functional layer is exposed inside the recess, forming a silicide layer on a surface of the silicon functional layer exposed inside the recess, forming a diffusion barrier layer on the silicide layer, depositing and structuring a first and second metallization layer in such a way that a supply line and two connection elements are formed, forming the oscillating structure by structuring the silicon functional layer, the silicon functional layer of the oscillating structure being able to be electrically contacted via the first connection element and forming a lower electrode of the resonator, the first metallization layer of the oscillating structure being able to be electrically contacted via the second connection element and forming an upper electrode of the resonator.

14 Claims, 5 Drawing Sheets

(58) Field of Classification Search
CPC ....... H03H 2003/027; H03H 2009/241; H03H 2009/155; Y10T 29/42; Y10T 29/49005; B81C 1/00142

See application file for complete search history.

(56) References Cited

U.S. PATENT DOCUMENTS 8,367,305 B1 * 2/2013 Wojciechowski ... H03H 9/2405
430/319
9,203,134 B1 * 12/2015 Henry ...................... H03H 3/04

* cited by examiner

METHOD FOR MANUFACTURING A PIEZOELECTRIC RESONATOR

CROSS REFERENCE

The present application claims the benefit under 35 U.S.C. § 119 of German Patent Application No. DE 10 2021 200 518.7 filed on Jan. 21, 2021, which is expressly incorporated herein by reference in its entirety.

FIELD

The present invention is directed to a method for manufacturing a piezoelectric resonator.

BACKGROUND INFORMATION

Piezoelectric MEMS resonators based on silicon offer the advantage, in addition to a high level of resonance sharpness and a small form factor, that they may be manufactured as integrated components of silicon chips. The actuator which generates the conversion of an electrical signal into a mechanical oscillation is typically a piezoelectric layer here, which is situated as part of a sandwich structure between two electrodes and elastically deforms under the action of the field generated by the electrodes.

Such a silicon resonator is described, for example, in the document "Experimental study of the effects of size variations on piezoelectrically transduced MEMS resonators" by Jaakkola et al. (2010 IEEE International Frequency Control Symposium, Newport Beach, C A, 2010, pp. 410-414). The resonator described therein is made up of a square plate made of monocrystalline silicon having a high level of p-doping, which is attached at the corners to the substrate using flexible anchors. The electromechanical coupling is achieved via a layer made of aluminum nitride (AlN), which is deposited on the plate. A molybdenum layer situated on this piezoelectric layer acts as the upper electrode, while the lower electrode is formed by the silicon plate itself. An electrical alternating field may be applied at the AlN layer by corresponding contacting of the electrodes, by which various oscillation modes of the resonator may be excited, whose shape and frequency are essentially determined by the geometry of the resonator and in particular by its lateral dimensions.

SUMMARY

It is an object of the present invention to provide a cost-effective MEMS process for a high-performance and compact resonator including a piezoelectric functional layer.

The method in accordance with an example embodiment of the present invention, permits, in contrast to the related art, a cost-effective, highly parallel MEMS process to be implemented, using which a maximum overlap of the piezoelectric layer with both electrodes and thus a maximum electromechanical efficiency of the resonator may be achieved, at the same time a high level of electrical conductivity of the wire-bondable connection elements and supply lines being ensured. The two soft metallization layers do not result in stiffening or in mechanical tensions or tensions having pronounced temperature dependence on the resonator with high conductivity. Furthermore, the resonator results by way of the method, whose piezoelectric layer has very minor variations in the layer thickness and which overall displays very minor structural variations from component to component.

The multilayer system which is generated and structured by the method according to an example embodiment of the present invention includes at the beginning at least one highly-doped, in particular p-doped silicon functional layer, which is situated in parallel to a substrate wafer. Lateral directions (i.e., extending in parallel to the main extension plane) and a direction extending perpendicularly to the main extension plane, which is also denoted hereinafter as the vertical direction, are defined by the main extension plane of the silicon functional layer or the substrate. The extension of the various layers in the vertical direction is denoted as the thickness and the mutual location of the layers is denoted by the terms "above" and "below." The formation steps of the method according to the present invention are carried out in a first, second, and third lateral area, which are each different from one another and/or are spaced apart from one another in the lateral direction. In the first lateral area, the oscillating structure of the resonator is formed, in the second area the connection for the lower electrode is formed, and in the third area the connection for the upper electrode is formed. The first connection element in the second area is connected via the recess in the piezoelectric layer to the underlying silicon layer, which is in turn connected via the anchor of the oscillating structure to the silicon layer of this structure, which functions in this way as the lower electrode. The second connection element in the third area is connected via the supply line to the first metallization layer on the oscillating structure, so that it may be contacted via the second connection element and forms the upper electrode for the piezoelectric layer. In addition, it is possible that the piezoelectric layer includes two or more recesses, which may be designed similarly to the first recess in particular.

A cavity is situated in the first area below the silicon functional layer, which may be formed in particular by etching the substrate or a sacrificial layer. In particular material under the entire surface of the first lateral area is removed, so that this area is exposed at the bottom. In the second and third area, at least one dielectric layer is preferably situated between substrate and silicon functional layer, which electrically isolates these two layers from one another and/or which was used as an etching mask for the cavity.

After the deposition of a piezoelectric layer, a sacrificial layer, in particular made of silicon oxide, is deposited. Due to the sacrificial layer, the required overetching of the metallization layers of the contact is absorbed in the sacrificial layer, so that no material removal of the piezoelectric layer takes place, which would result in disadvantageous variations of the layer thicknesses. A sacrificial layer made of oxide may be removed in particular via gas phase hydrofluoric acid etching, biochemical-physical dry etching, or by etching using an aqueous hydrofluoric acid solution. The recess is then formed in the sacrificial layer and the piezoelectric layer, due to which a surface of the silicon functional layer is exposed inside the recess (contact hole). To increase the electrical contact between the silicon layer and the subsequently deposited metallization layers, initially a silicide layer is formed. To suppress the diffusion of metal into the silicon layer, a diffusion-inhibiting layer is deposited following the silicide formation. The silicide layer and the barrier layer are preferably deliberately removed around the recess, since these are rigid, mechanically tensioned layers here, which are not permitted to be present on the resonator structure. Two metallization layers are subsequently deposited.

The first and second metallization layer may each be made up predominantly, essentially, or completely of gold, for example. In particular, the second metallization layer is thicker than the first metallization layer.

During the subsequent structuring of the first lateral area, by which the oscillating structure is exposed with respect to the lateral directions, in particular one, two, or more anchors are also formed, via which the silicon layer of the oscillating structure is connected to the silicon layer of the second area and preferably also to the silicon layer of the third area. The silicon functional layer of the oscillating structure fulfills a double function in the resonator manufactured using the method according to the present invention. On the one hand, it forms the oscillating body to excite the resonator modes, on the other hand, it functions as the lower electrode for the piezoelectric layer situated on the silicon layer.

Advantageous embodiments and refinements of the present invention may be derived from the description herein with reference to the drawings.

According to one preferred specific embodiment of the present invention, it is provided that the piezoelectric layer includes aluminum nitride. According to another specific embodiment, the silicide layer includes platinum and nickel. According to another specific embodiment, the diffusion barrier layer includes tantalum and tantalum nitride. According to another preferred specific embodiment, first and second metallization layer 7, 8 include gold, first metallization layer 7 being made up in particular of a layer sequence made up of a thin tantalum layer, a platinum layer, a gold layer, a further platinum layer, and a further thin tantalum layer, second metallization layer 8 in particular being made up of a layer sequence made up of a tantalum layer and a gold layer. The silicide layer is preferably formed using a combination of platinum and nickel. Both materials are good silicide-forming agents and nickel additionally enables outstanding adhesion on both the oxide surface and on an AlN side wall of the recess. The above-described material combination deliberately matched with one another has proven to be optimum for the silicide and barrier layers for the special requirements for the metal-silicon contact. Due to the combination according to the present invention, a good electrical contact is established and efficient inhibition of the gold diffusion is achieved, good adhesion on the oxide and a low layer thickness are achieved. In addition, outstanding stability of the electrical contact and the barrier with respect to thermal stresses result in following processes (for example, wafer bonding). The silicide layer may include platinum-nickel silicide (NiptSi) or may be made up of platinum-nickel silicide. The barrier layer is preferably made up of tantalum and tantalum nitride. The first metallization layer is preferably made up of a layer sequence tantalum/platinum/gold/platinum/tantalum. The two thin tantalum layers are adhesive layers to the underlying aluminum nitride and to the layer lying above, in particular the first mask layer. The second metallization layer is preferably made up of a layer of tantalum, followed by a thick gold layer.

According to one preferred specific embodiment of the present invention, it is provided that before the piezoelectric layer is deposited in the third lateral area, an oxidized partial area of the silicon functional layer is formed, the second connection element being formed above the oxidized partial area in such a way that the second connection element is shielded at the bottom by the oxidized partial area. The oxidized partial area causes an advantageous reduction or suppression of the parasitic capacitance in this way.

The oxidized partial area is preferably formed by the following steps: isotropic etching of the silicon functional layer, thermal oxidation of the silicon functional layer, wet-chemical structuring of the oxidized silicon functional layer in such a way that a surface of the oxidized partial area and the surface of a non-oxidized partial area extend flush. After the oxide has been formed, it is structured by wet chemistry in such a way that it exclusively remains in the formed depression. The interaction of the silicon etching depth and the oxide thickness is preferably selected in such a way that the center of the second connection element subsequently formed lies level with the surface of the silicon layer. The interaction of the masks, the isotopic silicon etching, and the oxide etching, as well as the underetching of the oxide mask is preferably selected in such a way that only a minimal topography remains at the transition between silicon and. Due to this effort to minimize topography, the most level possible surface is advantageously generated for the critical lithography for the resonator structuring.

According to one preferred specific embodiment of the present invention, the depositing and structuring of the first and second metallization layer in the first lateral area take place in such a way that the first metallization layer completely covers a surface of the piezoelectric layer and the second metallization layer is structured in such a way that it covers a partial area of the first metallization layer and does not cover a further partial area of the first metallization layer. The partial area covered by the second metallization layer significantly increases the conductivity of the arrangement formed by the first and second metallization layer. The second metallization layer is preferably situated on the oscillating structure only in those areas which are relatively unimportant for the oscillation behavior. However, it is also possible to generate an additional mass occupancy and/or local stiffening of the resonator by these elements, using which, for example, undesired oscillation modes may be suppressed.

According to one preferred specific embodiment, the structuring of the second metallization layer is carried out by the following steps: depositing a first mask layer, chemical-physical dry etching of the first mask layer, the first mask layer only being partially removed in the vertical direction, etching the first mask layer, the first mask layer being completely removed in the vertical direction, the etching of the first mask layer being carried out by hydrofluoric acid gas phase etching, chemical-physical dry etching, or by etching using an aqueous hydrofluoric acid solution. The first mask layer is preferably an oxide layer. The structuring of this mask layer takes place in two stages in order to end the etching selectively at the first metallization layer. The mask layer is therefore partially removed in a first sub-step and in the second sub-step, with the aid of hydrofluoric acid gas phase etching, chemical-physical dry etching, or etching using an aqueous hydrofluoric acid solution, completely removed down to the first metallization layer in a selective manner. The second metal layer is preferably deposited having a layer sequence made up of tantalum and the thicker gold layer and structured using stop in the sacrificial oxide.

According to one preferred specific embodiment of the present invention, it is provided that the formation of the oscillating structure is carried out by depositing and structuring a second mask layer, the first metallization layer, the piezoelectric layer, and the silicon functional layer being completely removed in the vertical direction during the etching outside the etching mask defined by the second mask layer. The second mask layer is preferably also an oxide layer. The layer thickness of the second mask layer is preferably oriented according to the oxide removal during the aluminum nitride and silicon etching. A lithography step is used, using which the entire layer stack is structured in the first area: oxide hard mask, thin gold electrode, aluminum nitride, and silicon functional layer. A maximum overlap of the piezoelectric layer with both electrodes thus advantageously results and thus a maximum electromechanical efficiency of the resonator. A further advantage which results due to the oxide hard mask is the steeper etching angle during the aluminum nitrate structuring and the better electrode overlap thus resulting.

The silicide layer is preferably formed by depositing platinum and nickel and subsequent thermal silicidation, the thermal silicidation in particular taking place at a temperature of 250° C. to 450° C.

The structuring of the second metallization layer is preferably carried out by ion beam etching. The ion beam etching particularly preferably takes place at an oblique angle of incidence, so that underetching of the first and/or second mask layer results.

According to one preferred specific embodiment of the present invention, it is provided that lateral variations of the thickness of piezoelectric layer 3 are reduced after the deposition by an ion-beam trimming process.

A further subject matter of the present invention is a piezoelectric resonator, manufactured by a specific embodiment of the method according to the present invention.

Exemplary embodiments of the present invention are shown in the figures and explained in more detail below.

DETAILED DESCRIPTION OF EXAMPLE EMBODIMENTS

Figure 1:
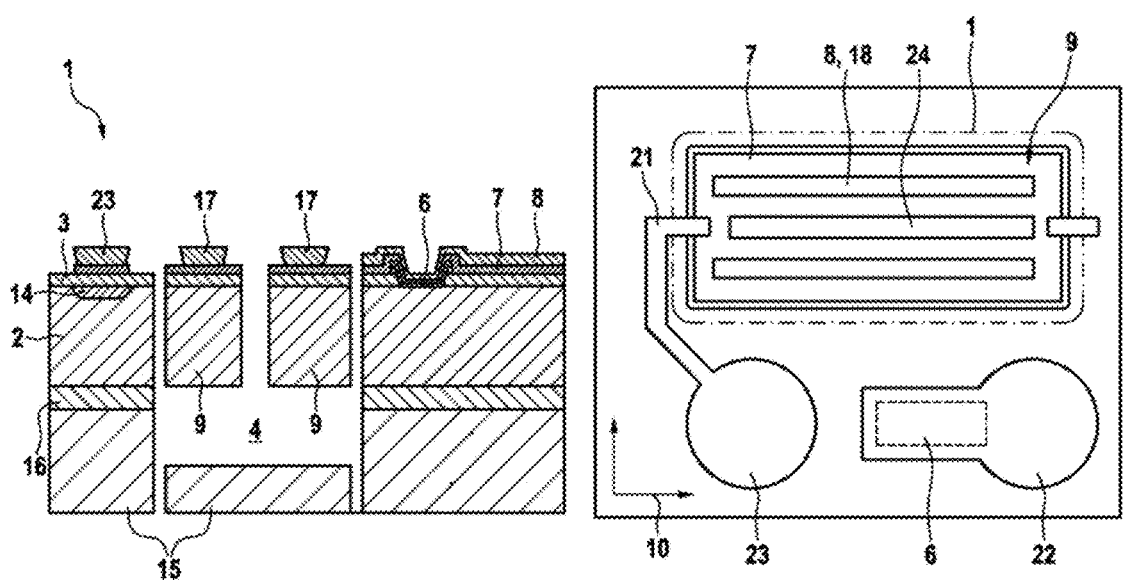
FIG. 1 shows a resonator manufactured using one specific embodiment of the method according to the present invention.

FIG. 1 shows a cross section (left) and a top view (right) of one specific embodiment of resonator 1 according to the present invention. The directions in parallel to main extension plane 10 of the arrangement are also denoted as lateral directions hereinafter, while the directions perpendicular thereto are described by the terms "upward" and "downward." Resonator 1 includes an oscillating structure 9, which is formed from a silicon body 9 including a centrally situated recess 24. Oscillating structure 9 is situated above a substrate wafer 15, into which a cavity 4 was etched to expose resonator 1. The oscillating structure may include a single movable body 9 or a plurality of movable bodies 9. Body 9 is formed by structuring a highly-doped silicon functional layer 2, which is mechanically connected to substrate 15 outside oscillating structure 9 via a dielectric layer 16. A piezoelectric aluminum nitride layer 3 is situated on oscillating structure 9, using which, body 9 may be excited to oscillations. The deformations of piezoelectric layer 3 are driven via an electrical field generated with the aid of two electrodes. The lower electrode is formed by silicon layer 2 of body 9 itself, while the upper electrode is made up of a thin metallization layer 7, which is made up of a layer sequence made of tantalum/platinum/gold/platinum/tantalum and is situated on piezoelectric layer 3 of body 9. To electrically contact these two electrodes, the surface of the component includes two bond pads 22 and 23, of which the first is connected via a metal silicon contact 6 to underlying part 17 of silicon layer 2 and contacts oscillating structure 9 via its anchor. The upper electrode, i.e., gold layer 7, is connected via a supply line 21 to second bond pad 23, a dielectric area 14 being situated under bond pad 23 below piezoelectric layer 3, which reduces the parasitic capacitance of contact element 23. Bond pads 22, 23 and supply line 21 are each formed from thin metallization layer 7 and a thicker gold layer 8 arranged above it. In addition, oscillating structure 9 includes a structured layer 18 of thicker gold layer 8 in mechanically noncritical areas in order to improve the electrical conductivity accordingly.

Figure 2A:
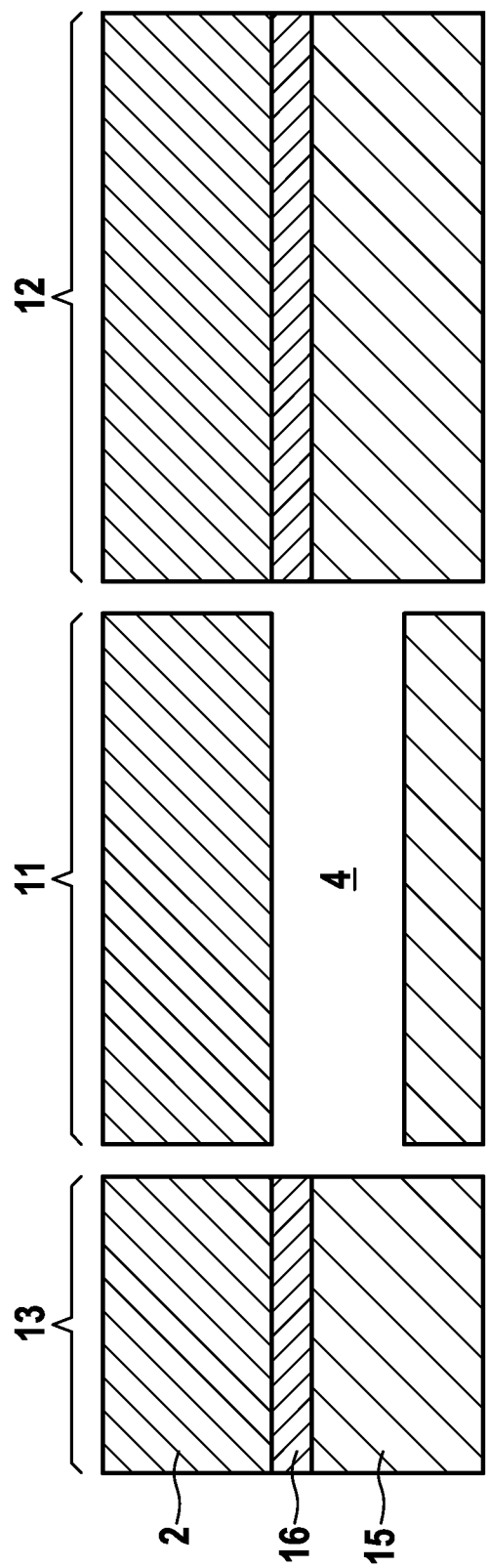
FIGS. 2A-2H illustrate the steps of one specific embodiment of the method according to the present invention.

As shown in FIG. 2A, the starting point for the method according to the present invention is a silicon layer 2 situated above a wafer substrate 15 including a hidden cavity 4 for resonator 1. Three lateral areas 11, 12, 13 may be distinguished with respect to main extension plane 10 (cf. FIG. 1), cavity 4 being situated in area 11 and a dielectric layer 16, which electrically isolates silicon layer 2 with respect to substrate 15, being situated in areas 12 and 13 between substrate 15 and functional layer 2.

Figure 2B:
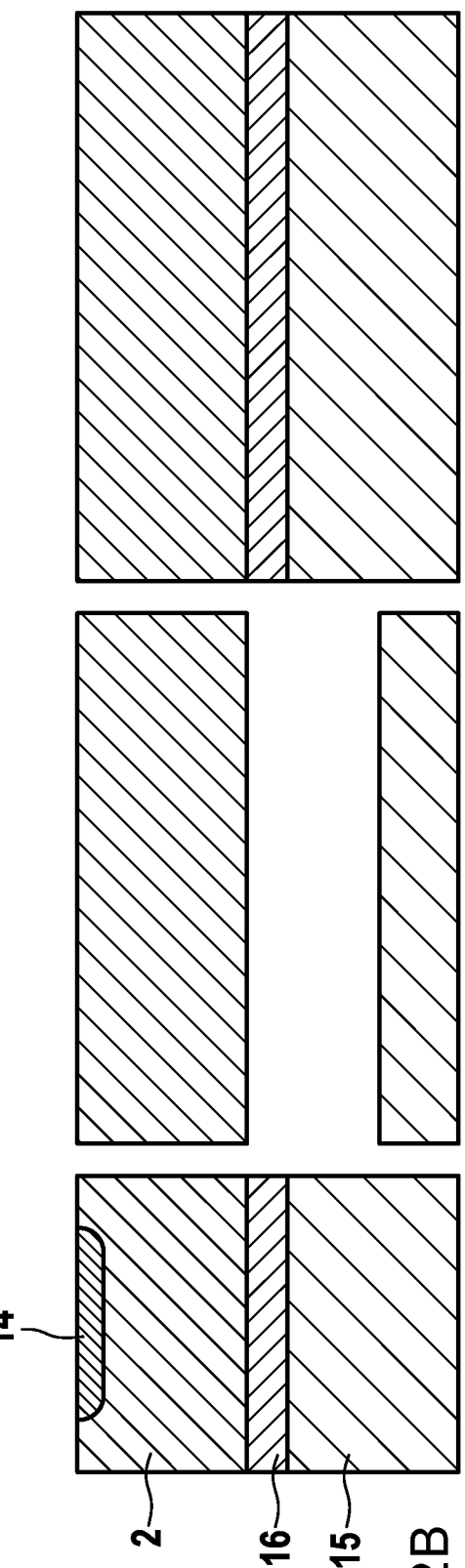

Subsequently, as shown in FIG. 2B, dielectric oxide layer 14 is applied to reduce the parasitic capacitance for the contacting of the upper electrode. For this purpose, first an isotropic silicon etching is carried out. The wafer is then thermally oxidized and the oxide is structured by wet chemistry in such a way that it only still remains in the depression. The interaction of the silicon etching depth and the oxide thickness is selected in such a way that the center of pad 23 is level with the surface of silicon layer 2. The interaction of the masks, the isotropic silicon etching, and the oxide etching, and also the underetching of the oxide mask is selected in such a way that only a minimal topography remains at the transition of silicon 2 to oxide 14. This effort to minimize the topography is necessary to achieve the most level possible surface for the critical lithography for the resonator structuring.

Figure 2C:
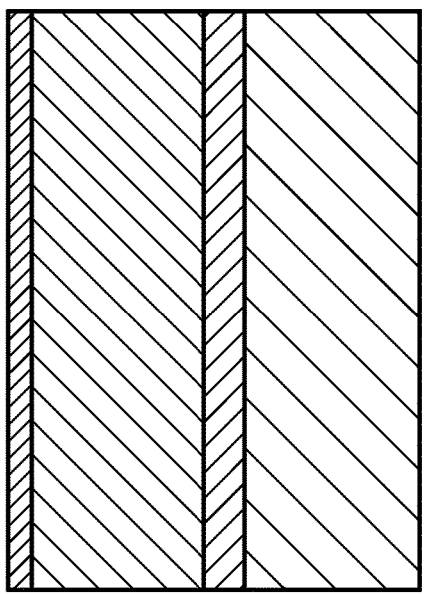
Figure 2C:
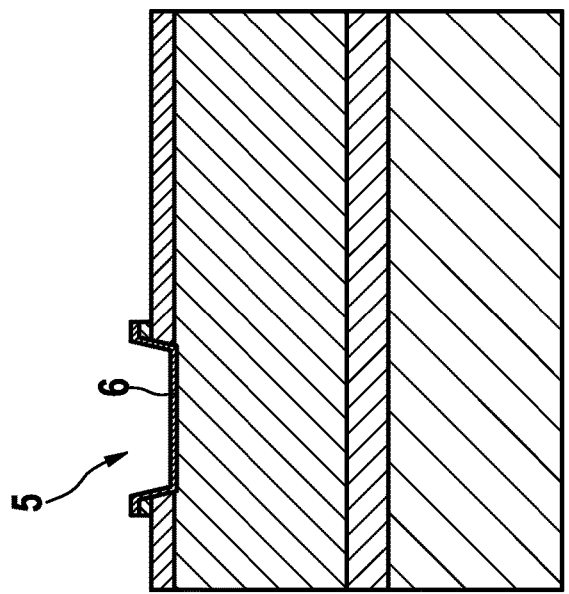

As shown in FIG. 2C, subsequently piezoelectric layer 3 made of aluminum nitride is deposited. Since this forms the active layer for resonator 1, the layer properties have to be supervised very precisely to obtain a high-performance resonator 1 which is also identical from component to component. One important variable here is the layer thickness, the layer thickness variation advantageously also being able to be reduced after the deposition by an ion beam trimming process.

Figure 2D:
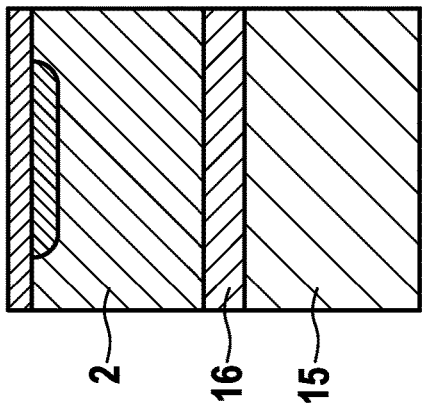
Figure 2D:
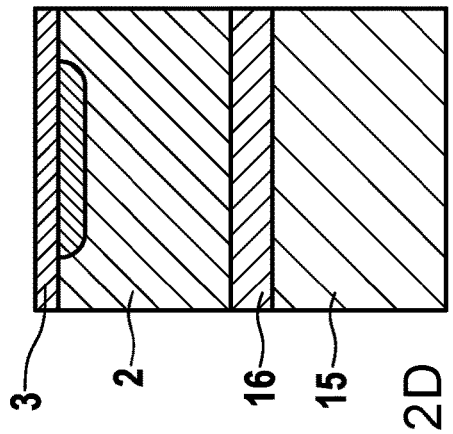

Subsequently, metal-silicon contact 6 is manufactured (FIG. 2D). For this purpose, first a sacrificial layer made of silicon oxide is deposited. The goal here is to absorb the occurring and necessary overetching of the metallization layers of contact 6 in the sacrificial layer and not to transfer it into aluminum nitride layer 3, which is critical with respect to layer thickness variation. The sacrificial layer and aluminum nitride 3 are then structured down into silicon 2. After the contact hole structuring, the silicide forming agent is deposited. It has been shown that a combination of platinum and nickel is particularly suitable for this purpose. The thermal silicidation takes place in a process window between 250° C. and 450° C. In addition, it is necessary to prevent the diffusion of gold into silicon 2. For this purpose, barrier layers made of tantalum and tantalum nitride are subsequently deposited. The silicide layer stack and barrier stack represent rigid, mechanically stressed layers which are not permitted to be present on the resonator structure and therefore are removed around contact hole 5. The oxide is removed very selectively in relation to the aluminum nitride via a gas phase hydrofluoric acid etching, chemical-physical dry etching, or etching using an aqueous hydrofluoric acid solution. The requirements for the silicide and barrier layers are: good electrical contact, adhesion on the oxide, prevention of gold diffusion into the silicon, low layer thicknesses and stability in relation to the oxide etching, thermal stability of the electrical contact and the barriers in relation to thermal stresses in the following process (for example wafer bonding).

Figure 2E:
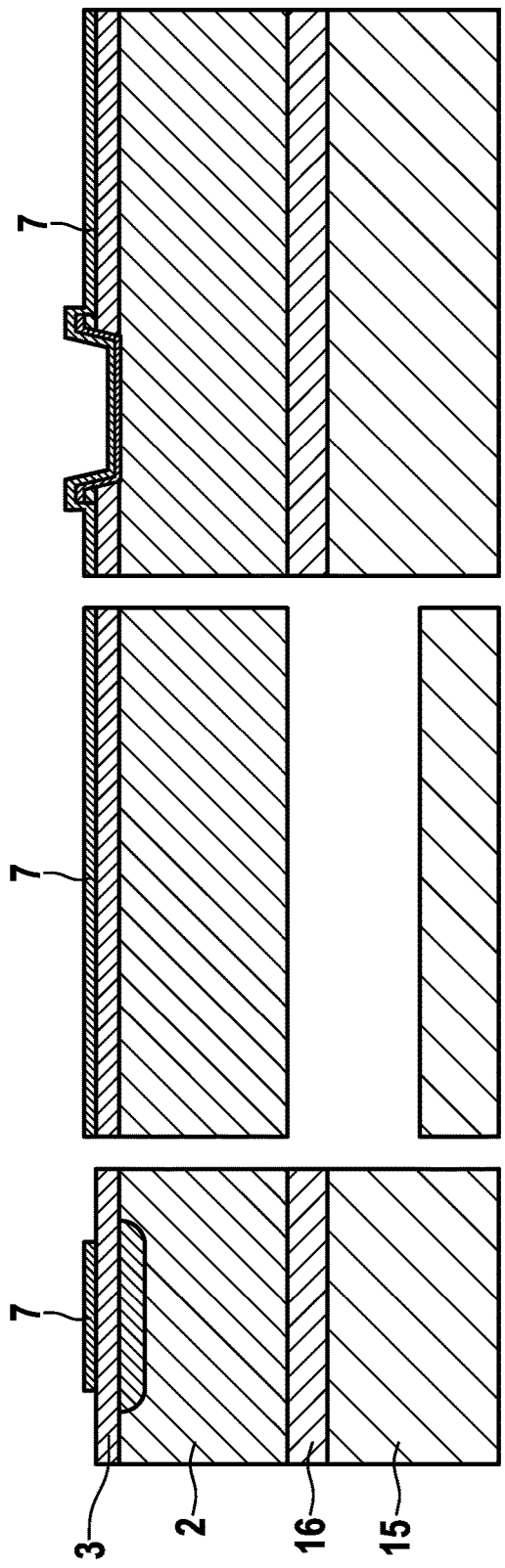

FIG. 2E illustrates the depositing and structuring of thin metallization layer 7. This is preferably made up of a layer sequence tantalum/platinum/gold/platinum/tantalum. The two thin tantalum layers are adhesive layers to underlying aluminum nitride 3 and to following second sacrificial oxide layer 19 (cf. FIG. 2F). Since resonator 1 and thus active aluminum nitride layer 3 is completely covered by thin metallization layer 7, the metal structuring may stop here directly in adjoining noncritical aluminum nitride 3.

Figure 2F:
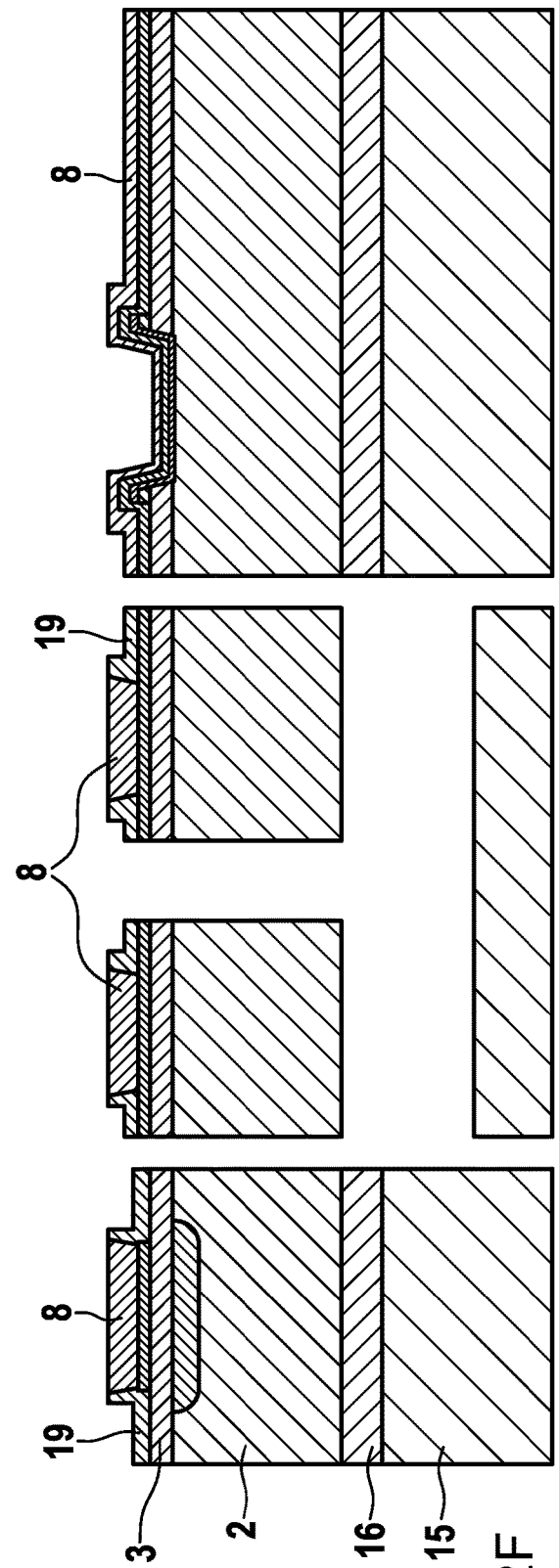

An oxide sacrificial layer 19 is once again necessary for the structuring of second metal layer 8, since it is otherwise not possible to selectively structure second gold layer 8 in relation to first gold layer 7. The structuring of oxide sacrificial layer 19 is in two stages (FIG. 2F). In the first structuring step, dry chemical-physical etching is carried out, entire layer 19 not being removed, however. The material removal is then stopped very selectively at thin gold layer 7 in the second structuring step with the aid of hydrofluoric acid gas phase etching. Alternatively, the etching may also be carried out with the aid of chemical-physical dry etching, in particular reactive ion etching (RIE) or etching using an aqueous hydrofluoric acid solution, the etching process having to be carried out in such a way that sufficient selectivity is provided in relation to thin gold layer 7. Subsequently, second metal layer 8 made up of tantalum and the thicker gold layer is deposited and structured using stop in the sacrificial oxide. Ion beam etching at an oblique angle of incidence may advantageously also be used for the structuring, for example, whereby underetching of the resist mask results. The processes and layer thicknesses were selected in such a way that the resulting topography of second metallization layer 8 is advantageously balanced out for the critical lithography for the resonator structuring. This includes: second metal layer 8 is embedded in sacrificial oxide 19. This is achieved by the selection of the layer thickness of oxide layer 19, which is adapted to the thickness of second metal layer 8 and the etching removal. In addition, the oxide etching strongly rounds the edges. The interaction of the masks, the oxide sacrificial layer etching, and the structuring of second metal layer 8, and the underetching of metal mask 19 is selected in such a way that only a minimal topography remains at the sacrificial oxide to second metal layer 8 transition.

Figure 2G:
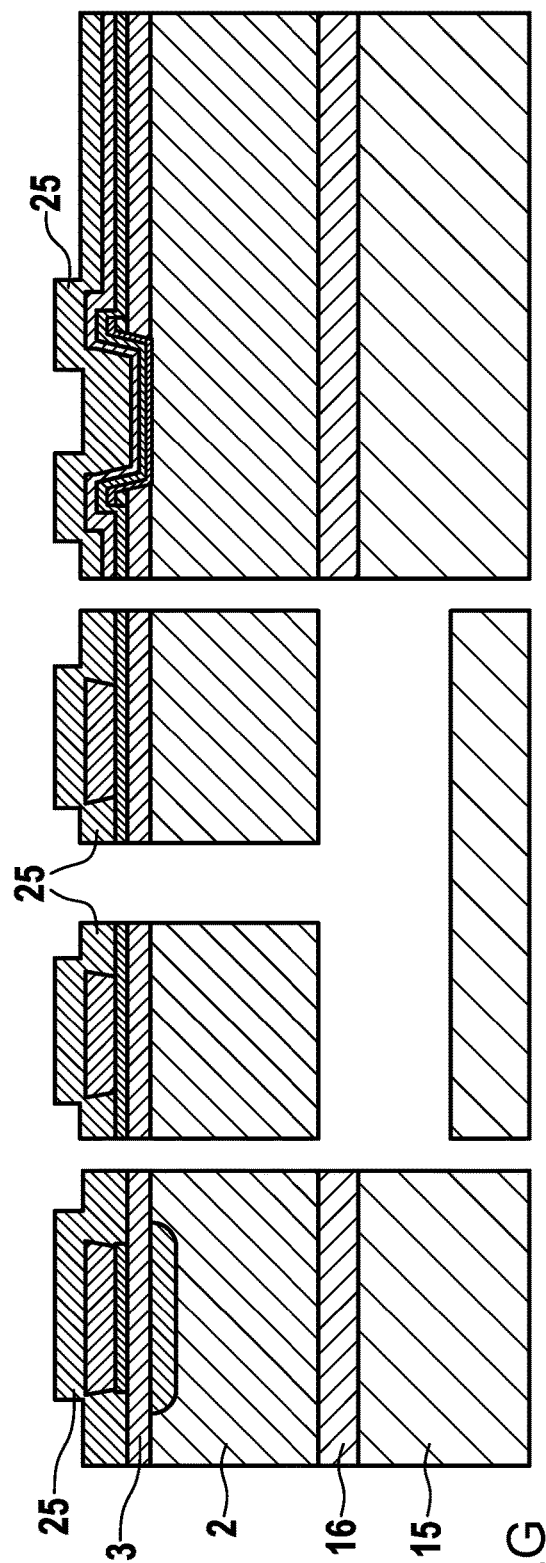

As illustrated in FIG. 2G, an oxide layer 25 is deposited once again, this time in the function of a hard mask for the resonator structuring. The layer thickness is oriented here to the oxide removal during the aluminum nitride and silicon etching. A single lithography step is used to carry out the structuring of the entire layer stack: oxide hard mask 25, thin gold electrode 7, aluminum nitride 3, and silicon functional layer 2. The maximum overlap of piezoelectric layer 3 with both electrodes thus results for the maximum electromechanical efficiency of resonator 1. A further advantage which results due to oxide hard mask 25 is the steeper etching angle during the aluminum nitride structuring and thus once again better electrode overlap.

Figure 2H:
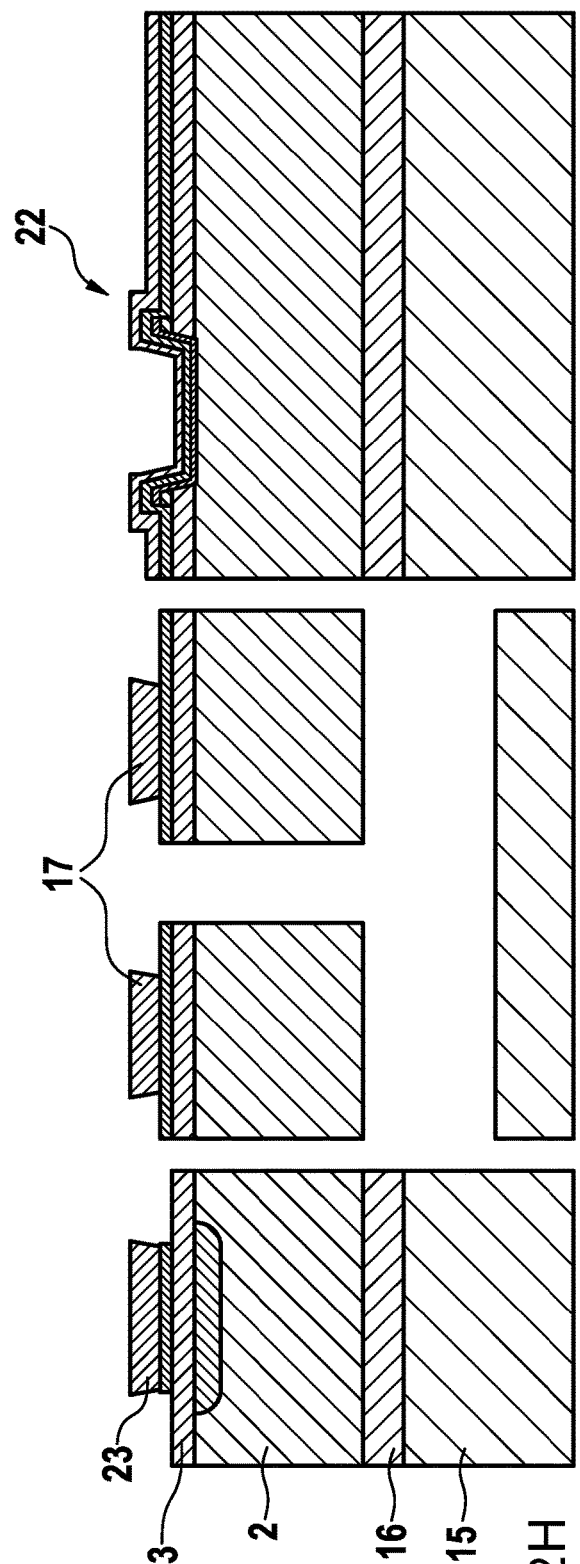

Finally, sacrificial oxide 19, 25 is removed with the aid of hydrofluoric acid gas phase etching, chemical-physical dry etching, or etching using an aqueous hydrofluoric acid solution and MEMS resonator 1 shown in FIG. 2H is finished.

What is claimed is:

1. A method for manufacturing a piezoelectric resonator, an oscillating structure of the resonator being formed from a highly-doped silicon functional layer, the silicon functional layer being situated above a substrate with respect to a vertical direction and including a lateral main extension plane including a first lateral area, a second lateral area, and a third lateral area, a cavity being situated in the first lateral area below the silicon functional layer, the method comprising the following steps:
   depositing a piezoelectric layer on the silicon functional layer;
   depositing a silicon sacrificial layer on the piezoelectric layer;
   forming at least one recess in the second lateral area in such a way that a surface of the silicon functional layer is exposed inside the recess, the recess extending in the vertical direction via a silicon oxide sacrificial layer and the piezoelectric layer;
   forming a silicide layer on a surface of the silicon functional layer exposed inside the recess;
   forming a diffusion barrier layer on the silicide layer;
   removing the silicon oxide sacrificial layer;
   depositing and structuring a first and second metallization layer on the piezoelectric layer and the diffusion barrier layer, a supply line, which electrically conductively connects the first and third lateral area, being formed by the structuring of the first and second metallization layer and a first connection element being formed by the structuring in the second lateral area and a second connection element being formed in the third lateral area; and
   structuring the silicon functional layer and the piezoelectric layer in such a way that the oscillating structure is formed in the first lateral area, the silicon functional layer of the oscillating structure being electrically conductively connected to the first connection element via the silicon functional layer of the second lateral area and forming a lower electrode of the resonator, which electrically contacts via the first connection element, the first metallization layer of the oscillating structure being configured to be electrically contacted via the second connection element and forming an upper electrode of the resonator.

2. The method as recited in claim 1, wherein the piezoelectric layer includes aluminum nitride.

3. The method as recited in claim 1, wherein the silicide layer includes platinum and nickel.

4. The method as recited in claim 1, wherein the diffusion barrier layer includes tantalum and tantalum nitride.

5. The method as recited in claim 1, wherein the first and second metallization layers include gold, wherein the first metallization layer being made up a layer sequence made up of a thin tantalum layer, a platinum layer, a gold layer, a further platinum layer, and a further thin tantalum layer, and wherein the second metallization layer being made up of a layer sequence made up of a tantalum layer and a gold layer.

6. The method as recited in claim 1, wherein before the deposition of the piezoelectric layer in the third lateral area, an oxidized partial area of the silicon functional layer is formed, the second connection element being formed above the oxidized partial area in such a way that the second connection element is shielded at a bottom by the oxidized partial area.

7. The method as recited in claim 6, wherein the oxidized partial area is formed by the following steps:
   isotropic etching of the silicon functional layer;
   thermal oxidation of the silicon functional layer; and wet-chemical structuring of the oxidized silicon functional layer in such a way that a surface of the oxidized partial area and a surface of a non-oxidized partial area extend flush.

8. The method as recited in claim 1, wherein the depositing and structuring of the first and second metallization layers in the first lateral area take place in such a way that the first metallization layer completely covers a surface of the piezoelectric layer and the second metallization layer is structured in such a way that the second metallization layer covers a partial area of the first metallization area and does not cover a further partial area of the first metallization layer.

9. The method as recited in claim 1, wherein the structuring of the second metallization layer is carried out by the following steps:
   depositing a first mask layer;
   chemical-physical dry etching of the first mask layer, the first mask layer being only partially removed in the vertical direction; and
   etching the first mask layer, the first mask layer being completely removed in the vertical direction, the etching of the first mask layer being carried out by hydrofluoric acid gas phase etching, or by chemical-physical dry etching, or by etching using an aqueous hydrofluoric acid solution.

10. The method as recited in claim 1, wherein the formation of the oscillating structure is carried out by depositing and structuring a second mask layer, the first metallization layer, the piezoelectric layer, and the silicon functional layer being completely removed in the vertical direction during the etching outside an etching mask defined by the second mask layer, the etching of the second mask layer being carried out by hydrofluoric acid gas phase etching, or by chemical-physical dry etching, or by etching using an aqueous hydrofluoric acid solution.

11. The method as recited in claim 1, wherein the silicide layer is formed by deposition of platinum and nickel and subsequent thermal silicidation, the thermal silicidation taking place at a temperature of 250° C. to 450° C.

12. The method as recited in claim 1, wherein the structuring of the second metallization layer is carried out by ion beam etching.

13. The method as recited in claim 1, wherein lateral variations of a thickness of the piezoelectric layer are reduced after the deposition by an ion beam trimming process.

14. A piezoelectric resonator, an oscillating structure of the resonator being formed from a highly-doped silicon functional layer, the silicon functional layer being situated above a substrate with respect to a vertical direction and including a lateral main extension plane including a first lateral area, a second lateral area, and a third lateral area, a cavity being situated in the first lateral area below the silicon functional layer, the resonator being formed by:
   depositing a piezoelectric layer on the silicon functional layer;
   depositing a silicon sacrificial layer on the piezoelectric layer;
   forming at least one recess in the second lateral area in such a way that a surface of the silicon functional layer is exposed inside the recess, the recess extending in the vertical direction via a silicon oxide sacrificial layer and the piezoelectric layer;
   forming a silicide layer on a surface of the silicon functional layer exposed inside the recess;
   forming a diffusion barrier layer on the silicide layer;
   removing the silicon oxide sacrificial layer;
   depositing and structuring a first and second metallization layer on the piezoelectric layer and the diffusion barrier layer, a supply line, which electrically conductively connects the first and third lateral area, being formed by the structuring of the first and second metallization layer and a first connection element being formed by the structuring in the second lateral area and a second connection element being formed in the third lateral area; and
   structuring the silicon functional layer and the piezoelectric layer in such a way that the oscillating structure is formed in the first lateral area, the silicon functional layer of the oscillating structure being electrically conductively connected to the first connection element via the silicon functional layer of the second lateral area and forming a lower electrode of the resonator, which electrically contacts via the first connection element, the first metallization layer of the oscillating structure being configured to be electrically contacted via the second connection element and forming an upper electrode of the resonator.

\* \* \* \* \*